United States Patent [19]

Bull

[11] Patent Number: 5,506,586
[45] Date of Patent: Apr. 9, 1996

[54] MULTIPLE-HYPOTHESIS, MULTIPLE-MATCHED FILTER SYSTEM

[75] Inventor: James G. Bull, Issaquah, Wash.

[73] Assignee: The Boeing Company, Seattle, Wash.

[21] Appl. No.: 216,551

[22] Filed: Mar. 22, 1994

[51] Int. Cl.$^6$ .................................................. G01S 13/46
[52] U.S. Cl. ............................................................. 342/148
[58] Field of Search ............................................. 342/148

[56] References Cited

U.S. PATENT DOCUMENTS

| | | | |
|---|---|---|---|
| 3,307,185 | 2/1967 | Mefford | 343/17.1 |
| 3,356,947 | 12/1967 | Di Toro | 325/42 |
| 3,617,889 | 11/1971 | Rabinowitz | 325/30 |
| 3,701,154 | 10/1972 | McKinney | 343/18 E |
| 3,876,941 | 4/1975 | Kohlenberg et al. | 325/65 |
| 4,012,740 | 3/1977 | Lenneper | 342/428 |
| 4,280,128 | 7/1981 | Masak | 342/380 |
| 4,449,127 | 5/1984 | Sanchez | 342/80 |
| 4,457,007 | 6/1984 | Gutleber | 375/102 |
| 4,608,569 | 8/1986 | Dickey, Jr. et al. | 342/384 |
| 4,628,517 | 12/1986 | Schwarz et al. | 375/40 |
| 4,669,091 | 5/1987 | Nossen | 375/14 |
| 4,672,638 | 6/1987 | Taguchi et al. | 375/99 |
| 4,675,880 | 6/1987 | Davarian | 375/39 |
| 4,837,574 | 6/1989 | Hill | 342/27 |
| 5,075,695 | 12/1991 | Baghdady | 342/433 |
| 5,264,857 | 11/1993 | Baghdady | 342/433 |

OTHER PUBLICATIONS

Dennis R. Morgan, "Adaptive Multipath Cancellation for Digital Data Communications," IEEE Transactions on Communications, vol. Com–26, No. 9, Sep. 1978, pp. 1380–1390.

Primary Examiner—John B. Sotomayor
Attorney, Agent, or Firm—Christensen, O'Connor, Johnson & Kindness

[57] ABSTRACT

A multiple-hypothesis, multipath-matched filter (10) is disclosed for use in combining multipath components of transmissions between, for example, an aircraft (12) and aircraft (14) through a multipath environment (16). Rather than sensing the characteristics of the environment and adjusting the multipath components accordingly, the disclosed filter is designed on the basis of several hypotheses concerning the differences in the path lengths traversed by the various multipath components, as well as the phase shift introduced into each. In a preferred arrangement, the path length differences ΔR are assumed to be some integer multiple of the range gate setting δR of a transmitter/receiver (28) included on the aircraft. The phase shifts ψ are assumed to be either 0° or 180°. Although the hypotheses result in some attenuation of the resultant combined multipath signal R, when compared to an ideal filter (58), a significantly enhanced output is achieved without requiring detailed information about the environment. Both hardware and software implementations of the filter are disclosed.

7 Claims, 9 Drawing Sheets

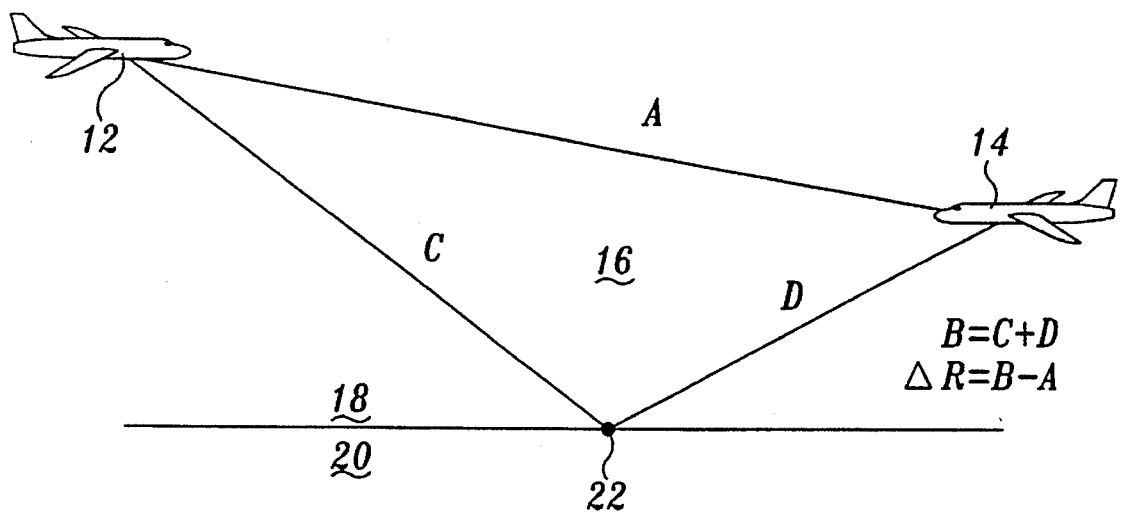
Fig.1.
| PATH | TRANSMIT | RECEIVE | RELATIVE DELAY |
|------|----------|---------|----------------|
| I    | A        | A       | 0              |
| II   | A        | B       | $\Delta R$     |
| III  | B        | A       | $\Delta R$     |
| IV   | B        | B       | $2\Delta R$    |
Fig.2.
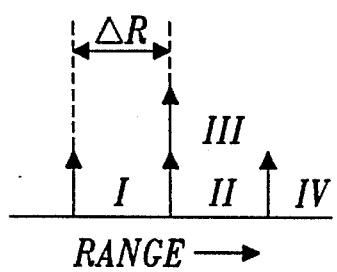
Fig.3.

MULTIPLE-HYPOTHESIS, MULTIPLE-MATCHED FILTER SYSTEM

FIELD OF THE INVENTION

This invention generally relates to signal processing techniques, and more particularly, to techniques for processing multipath signals.

BACKGROUND OF THE INVENTION

The operation of many systems depends upon their ability to transmit signals through a particular transmission medium. If possible, a medium is preferably selected to conduct transmissions without interference or disruption, although some attenuation typically occurs. Often, a medium of this type is relatively confined and uniform.

In most instances, however, a system is required to transmit signals through a medium that may be disruptive. For example, radar and communication systems regularly transmit electromagnetic energy through the atmosphere. Although the beam of such transmissions may be controlled, to some extent, by the system, the atmosphere is an unconfined, multipath transmission medium that can affect the quality of the transmitted signal.

In a multipath medium, a transmission may follow several different paths as it travels from one point to another. Because of differences in the various paths, a portion of a transmission traveling along one path may reach a given point at a different time than a portion of the transmission following another path. Similarly, path differences may cause the phase of a portion traveling along one path to differ from the phase of a portion traveling along another path.

As will be appreciated, the receipt of various portions of a transmission at different times and with different phases can make interpretation of the transmission difficult. To address this problem, systems have been developed that, for example, eliminate potentially conflicting portions of a transmission upon receipt. One such system is described in the Background section of U.S. Pat. No. 4,669,091.

The system disclosed in the above-referenced patent uses a plurality of tapped delay lines to simulate the delays experienced by transmissions traveling along various multipaths. The tapped delay lines generate delayed replicas of the portions of the signal received from the various paths. These replicas are summed to produce an approximation of the distortion components in the received signal. This approximation is then subtracted from the received signal to produce an equalized signal, largely free of multipath distortion attributable to path length variations.

The delays required to produce the appropriate replicas can be manually adjusted for fixed channels or transmission media. If the transmission medium is in a state of flux, as in the case of an airborne radar system for detecting other airborne targets, however, manual control is typically inadequate to achieve the frequent adjustments required. As a result, some form of automatic control of system parameters is typically required.

In that regard, one approach described in this prior art patent involves the periodic transmission of a training signal having known characteristics, in place of the data. The influence of the multipath distortion upon the known training signal allows the characteristics of the distortion to be evaluated. With the multipath distortion characterized, the delays required to allow replicas of the distortion components to be produced can be easily determined. Unfortunately, the use of such a training signal increases system complexity and, because it must be periodically transmitted in place of data, reduces the system's data transmission capacity.

The referenced patent itself discloses an alternative approach to the control of a multipath distortion correction equalizer for use with data burst communications in which no knowledge of the data content of the signal is available. In that regard, the multipath delay is established by autocorrelation and the phase shift and amplitude of a multipath replica, representing the multipath delayed components, are adjusted to minimize the noncarder spectral components of the replica. A received signal is then corrected by subtracting from it the multipath replica.

As will be appreciated, the approaches described above may be successfully used to remove or cancel multipath distortion from a received signal. In many applications, however, it would be desirable to retain and constructively use the multipath components. This approach is especially important in radar systems where the multipath components can be separated by time delay. More particularly, by summing the various multipath components received, it may be possible to increase the overall signal strength and, hence, the system's range. The useful summation of multipath distortion components can, however, be difficult to achieve, particularly in airborne applications, due to the varied and unpredictable nature of the multipath echo.

As the multipath environment varies, the multipath components received by the system will also vary. In some instances, these components may additively enhance the received signal, while, in other instances, the multipath components may destructively cancel the received signal.

On average, the coherent addition of the multipath components to the received signal increases the power of the received signal (because $$\int_0^{2\pi} (1 + \sin\theta)^2 d\theta > 1).$$

In spite of this average increase, however, the destructive influence of the multipath components (for certain values of relative phase, $\theta$) may be so great that it renders the received signal undetectable. As a result, even though the average performance of the system is enhanced, numerous "dropout" or "no-coverage" zones may exist.

In view of these observations, it would be desirable to provide a multipath system that processes multipath distortion components so as to increase the strength and power of received signals. It would further be desirable to provide such a system that ensures continuous coverage even when the multipath environment varies. Finally, it would be desirable for such a system to be relatively uncomplicated.

SUMMARY OF THE INVENTION

In accordance with this invention, a multiple-hypothesis method for processing signals propagating along a plurality of paths is disclosed. The method includes the step of delaying signals that have propagated along certain paths of a multipath environment by select delay times, and adjusting the phases of the signals by select phase adjustments to produce matched signals. The selected delay times are selected in accordance with a first hypothesis concerning the paths over which the signals propagate. The select phase adjustments are selected in accordance with a second hypothesis concerning the paths over which the signals propagate. The method also includes the step of combining the matched signals to produce a combined signal.

In accordance with further aspects of this invention, the first hypothesis concerning the paths concerns the delay experienced by signals traveling along the paths. The second hypothesis concerning the paths concerns the phase adjustment experienced by signals traveling along the paths. In addition, the processing system exhibits a bandwidth, with the selected delay times being selected from integer multiples of a value that is a function of the bandwidth. The select phase adjustments considered in an initial embodiment of this invention are selected from two values: 0° and 180°; in further embodiments, uniform phase increments such as 0°, 120°, and 240° are considered for selection.

In accordance with another aspect of this invention, a matched signal processing system is provided for processing a signal that is transmitted through a multipath environment including a direct path and first and second delay paths, for example, where a radar signal is transmitted from an airborne radar to detect a target and both the radar source and target are well above ground level. The difference between the length of the first delay path and the direct path defines a first path length difference and the difference between the second delay path and the direct path defines a second path length difference. The processing system includes a first delay circuit for receiving the signal and producing a first output that is delayed relative to the signal by an interval that is a function of the first path length difference. A second delay circuit is included to receive the first output and produce a second output. The second output is delayed relative to the signal by an interval that is a function of the second path length difference. With respect to the radar source, the delays provided by the first and the second delay circuits are substantially equal. A phase shift circuit is enclosed to shift the phase of the first output by an amount that is equal to the phase difference between signals transmitted along the direct path and the first delay path to produce a third output. Finally, a summation circuit is included to sum the signal, the second output, and the first output.

In accordance with yet another embodiment of the invention, a matched signal processing system is provided for processing a signal, which is transmitted through a multipath environment including a direct path and at least one delay path. The bandwidth of the system is a function of the difference between modulation characteristics of the transmitted signal, which in turn, determines the signal processing system's ability to resolve a delayed signal from a direct signal. The system includes a first time delay circuit for receiving the signal and producing a first output that is delayed relative to the signal by a first interval of time that is selected arbitrarily. A second time delay circuit, with a time delay that is substantially equal to the first time delay, receives the first output and produces a second output that is delayed relative to the first output by the first interval. A first phase shift circuit receives the first output and produces a third output having a phase that is shifted by 180° relative to the first output. A first summation circuit combines the signal, the first output, and the second output to produce a first combined signal and also combines the signal, the second output, and the third output to produce a second combined signal. A first detection output circuit combines the first combined signal and the second combined signal to produce a first detection output having an increased gain.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein:

FIG. 1 is a schematic illustration of a "multipath" system, depicting various signal paths between an airborne radar and an airborne target;

FIG. 2 is a chart identifying the paths illustrated in FIG. 1, for a radar application in which signals radiate back and forth between the airborne radar and the target, as well as the delay associated with each path relative to a "direct" path;

FIG. 3 is a graph illustrating the relative magnitude and temporal relationship of signals received at the airborne radar along the various paths of FIG. 2, under a specific set of circumstances;

DETAILED DESCRIPTION OF THE PREFERRED EMBODIMENTS

Figure 4D:
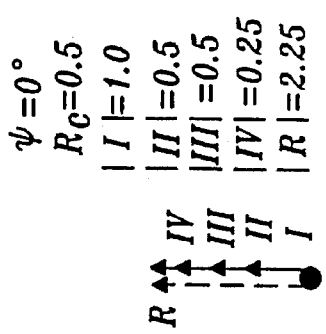
FIGS. 4A through 4D are graphs illustrating the vector summation of the signals of FIG. 3 under various circumstances.

Referring now to FIG. 1, an application for a multiple-hypothesis, multipath-matched filter 10, constructed in accordance with the present invention, is shown. This invention can be used both for processing communication signals that propagate between an aircraft 12 and an aircraft 14 and for processing radar signals that are transmitted from aircraft 12 and reflected from aircraft 14. As shown in FIG. 1, the two aircraft are in a multipath environment 16, because the signals that propagate through atmosphere 18 between aircraft 12 and aircraft 14 can propagate along different paths. The function of filter 10 is to efficiently combine the various components of any electromagnetic transmission that propagates along different paths in multipath environment 16.

Reviewing multipath environment 16 in greater detail, during a typical communication session between the two aircraft, aircraft 12 transmits an electromagnetic signal to, and receives a corresponding transmission from, aircraft 14 through multipath environment 16. Transmissions between aircraft 12 and aircraft 14 may travel along a direct path A through atmosphere 18. In addition, a reflected path B indirectly couples aircraft 12 and aircraft 14 and includes both a path segment C, that lies between aircraft 12 and a reflection point 22 on ground 20, and a path segment D, defined between reflection point 22 and aircraft 14.

For purposes of discussion, multipath environment 16 is depicted relatively simply in FIG. 1. As will be appreciated, however, multipath environment 16 will typically be more complex. For example, the ionosphere, like ground 20, may reflect transmissions between aircraft 12 and aircraft 14. In addition, more than one reflection point 22 may be involved.

In radar applications of the present invention, aircraft 12 transmits an electromagnetic signal to, and receives a reflection from, target aircraft 14 via multipath environment 16. As will be appreciated, a transmission from aircraft 12 to target aircraft 14 may propagate along direct path A. Reflection of the signal from target aircraft 14 can propagate along either direct path A or reflected path B. Alternatively, a transmission from aircraft 12 to target aircraft 14 may travel along reflected path B, and reflections from target aircraft 14 may follow either direct path A or reflected path B. Thus, the electromagnetic energy of the radar signal may traverse any of four different total paths from aircraft 12 to aircraft 14 and back, as listed in tabular form in FIG. 2.

The shortest path I is traversed by electromagnetic energy traveling both to and from aircraft 14 along direct path A. The next two shortest paths II and III are traversed by electromagnetic energy traveling to aircraft 14 along path A and back to aircraft 12 along path B, or to aircraft 14 along path B and back to aircraft 12 along path A, respectively. Finally, the longest path IV is traversed by electromagnetic energy transmitted to and from aircraft 14 along reflected path B.

Because path I is the shortest path, transmissions along this path will be the first to be received at aircraft 12 and can be considered as being received at a zero time that forms a temporal reference point for the other multipath components. The transmissions along paths II and III must, however, travel an additional distance $\Delta R$, equal to the length of path II or III minus the length of path I, i.e., the difference between the lengths of reflected path B and direct path A. Thus, transmissions received along paths II and III will be received at aircraft 12 after transmissions along path I, with the delay being a function of $\Delta R$. Because transmissions along path IV must traverse reflected path B in both directions, their receipt at aircraft 12 is delayed relative to transmissions along path I by an interval of time that is proportional to twice $\Delta R$.

FIG. 3 is a graph illustrating the temporal relationship between the transmission components received along paths I, II, III, and IV for a radar signal transmission. As shown, the path I component is received first, followed by the path II and III components at some range delay time $\delta R$ (dependent upon $\Delta R$). The path IV component then follows the path I component, with a delay of $2\delta R$. The representation of the various transmission components provided in FIG. 3 is, however, rather simplified. In that regard, each of these components is a vector, whose magnitude and phase, as well as time of receipt, are influenced by multipath environment 16. It is important to note, however, that the path length difference between path I and either path II or III, and between either paths II or III and path IV is in each case equal to $\Delta R$. Accordingly, the same relationship for $\delta R$ and the corresponding phase shifts exists in the signals traveling the various paths.

For example, the magnitude of the components may vary because ground 20 absorbs some of the energy of electromagnetic transmissions reflected from reflection point 22. The amount of energy reflected is a function of the reflection coefficient $R_c$ of ground 20. If reflection coefficient $R_c$ is equal to one, then all of the energy of a multipath component is reflected and the magnitudes of the path I, II, III, and IV components will be equal. On the other hand, if $R_c$ is equal to one-half, then the magnitude of the path II and III components will be one-half the magnitude of the path I component and the magnitude of the path IV component, which undergoes two reflections at point 22, will be one-fourth the magnitude of the path I component. The reflection coefficient of land and seawater, for low angles of incidence and horizontally polarized transmissions, is close to unity.

With respect to the phase, or direction, of the vectors representing the four transmission components, reference is made to FIGS. 4A through 4D. In that regard, the relative phase of the components received along paths I, II, III, and IV is represented by the relative angular orientation of the corresponding vectors in FIG. 4. As shown, the signal component reflected from aircraft 14 that propagates back to aircraft 12 along path I is referentially treated as having a zero phase.

The transmission components received along paths II and III then have a phase angle $\psi$ relative to the path I component. The phase angle $\psi$ is equal to a phase shift $\theta$ attributable to the greater distance $\Delta R$ traveled by transmissions along paths II and III, as well as a phase change $\phi$ attributable to ground 20 at reflection point 22. As will be appreciated, $\theta$ is equal to $\Delta R\,(2\pi)/\lambda$, where $\lambda$ is the wavelength of the signal transmitted. The phase change $\phi$ varies depending upon the nature of the reflecting material and its geometry, although for many geometries, $\phi$ will be nearly equal to 180°.

If the components received along the various paths I–IV are added together at the same time, the resultant combined multipath signal R includes an x-component $R_x$ and a y-component $R_y$, and:

$$R=R_x+R_y \tag{1}$$

With the reflection coefficient $R_c$ defining the signal attenuation introduced by reflections at reflection point 22, the x-component can be written as:

$$R_x=1+R_c(2\cos\psi+R_c\cos 2\psi) \tag{2}$$

and the y-component is equal to:

$$R_y=0+R_c(2\sin\psi+R_c\sin 2\psi) \tag{3}$$

The resultant magnitude of the combined multipath signal $|R|$ is then equal to:

$$|R|^2=R_x^2+R_y^2 \tag{4}$$

Figure 4C:
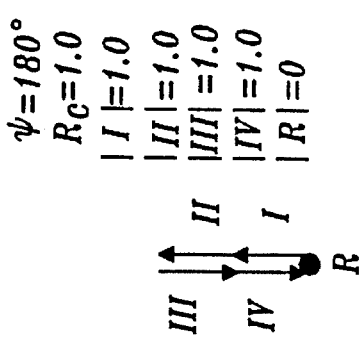
Figure 4B:
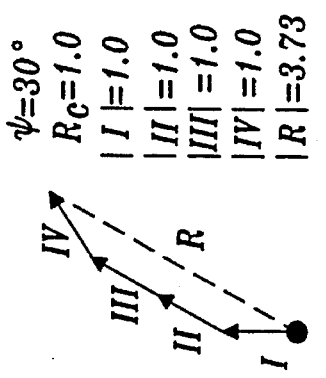
Figure 4A:
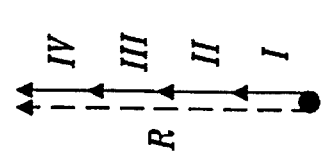

FIG. 4A illustrates the summation of multipath components to produce the resultant multipath signal R for a radar signal, where the reflection coefficient $R_c$ is equal to one and the phase difference $\psi$ is equal to zero. Under these circumstances, the four paths I, II, III, and IV do not attenuate, or shift the relative phase of, the corresponding four multipath signal components. As a result, each vector component in FIG. 4A is aligned and their magnitudes are at a maximum, causing a maximum resultant combined signal or vector R to be produced.

In FIG. 4B, the reflection coefficient $R_c$ is equal to one, but now the phase angle $\psi$ is equal to 30°. As a result, the orientation of the components associated with paths II, III, and IV is different than the orientation of the path I component and the magnitude of the resultant multipath vector R is decreased. In FIG. 4C, the reflection coefficient $R_c$ is again equal to one, but now the phase angle $\psi$ is equal to 180°. As a result, the transmission components received along paths II and III completely cancel the components received along paths I and IV. If the reflection coefficient $R_c$ is equal to one-half and the phase angle $\psi$ is equal to zero, the resultant multipath vector R is influenced in the manner shown in FIG. 4D.

Assuming that the signal components received along paths I, II, III, and IV are combined at the same time, the magnitude of the resultant multipath vector R varies from zero to four times the magnitude of the direct path I component. Thus, the power of the resultant signal that is reflected from aircraft 14 and received at aircraft 12 may vary from zero to 16 times the power of the signal that would be received in a multipath-free environment. The actual magnitude and power of the resultant multipath vector R is a function not only of the reflection coefficients $R_c$ involved, but also the phase angle $\psi$.

Both the reflection coefficient $R_c$ and phase angle $\psi$ may periodically change as the range and multipath geometry between aircraft 12 and aircraft 14 change. Consequently, the resultant combined multipath vector or signal R may experience complete reinforcement one moment and then complete cancellation a short time later. This variation causes periodic drop outs or fading in the coverage with time, as shown graphically in FIG. 5.

Figure 5:
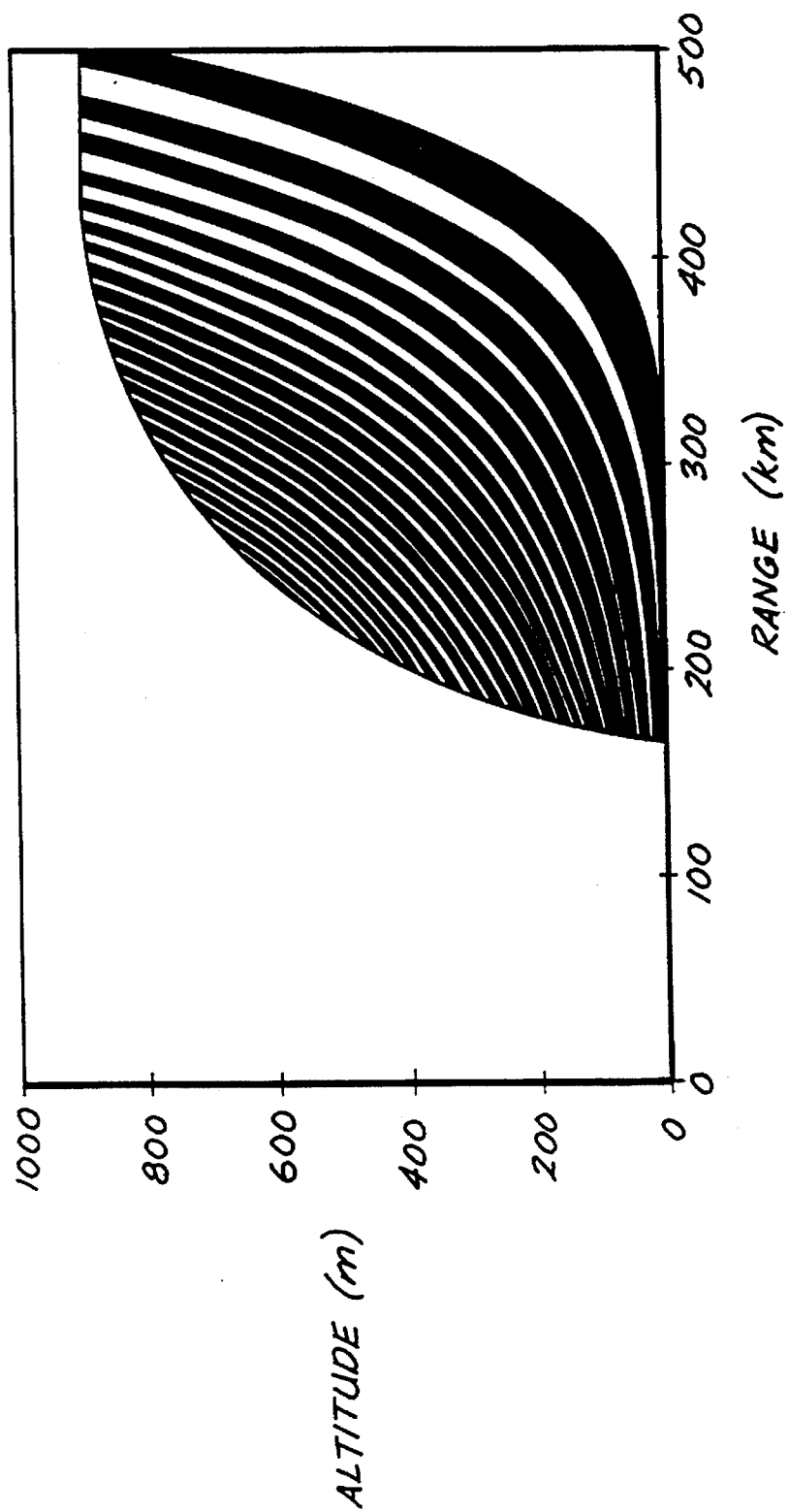
FIG. 5 is a graph illustrating the effects of multipath on the coverage of a prior art radar system (without benefit of signal processing in accordance with the present invention), illustrating regions of no coverage.
Figure 6:
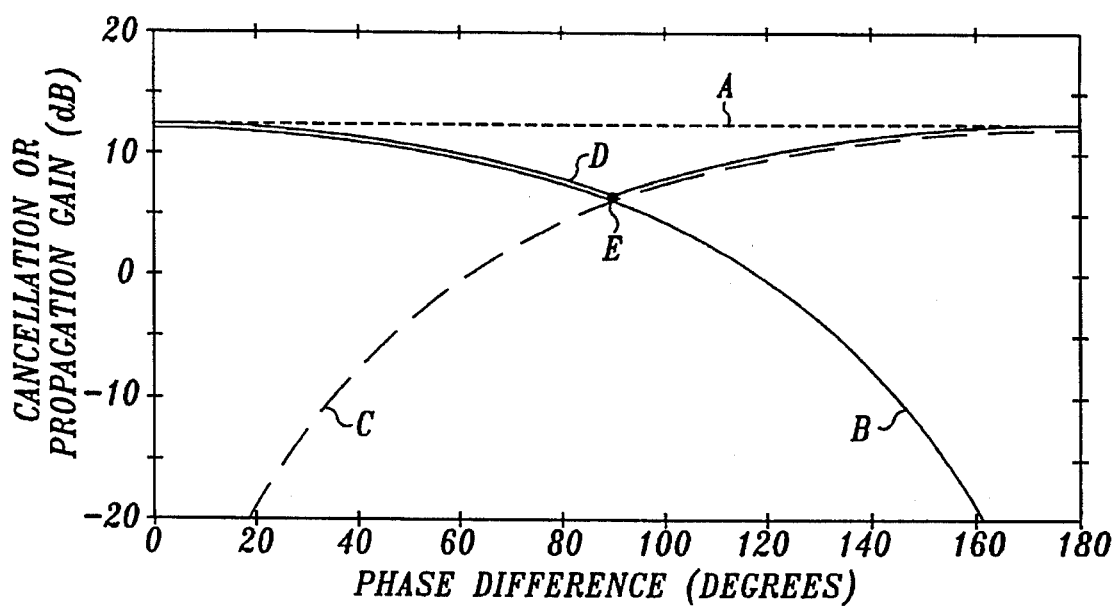
FIG. 6 is a graph illustrating the attenuation of a signal in a multipath environment as a function of the signal's phase angle.

Specifically, the dark bands of FIG. 5 represent areas in which the resultant signal is sufficiently strong to be detected. On the other hand, the white bands represent areas where the cancellative effect of the reflected signals in the multipath environment causes the combined multipath signal R to be too low to be detected. In FIG. 6, the attenuation of the combined multipath signal R due to multipath interference is plotted as a function of the phase angle $\psi$ (curve B).

Having reviewed the influence of multipath environment 16 on the combined multipath signal R, the construction and operation of filter 10 will now be considered in greater detail. Filter 10 combines the signal components from paths I, II, III, and IV in a manner that enhances the resultant signal strength, while avoiding the potentially cancellative effect of the multipath components represented in FIG. 4C and the white bands of FIG. 5.

Figure 7:
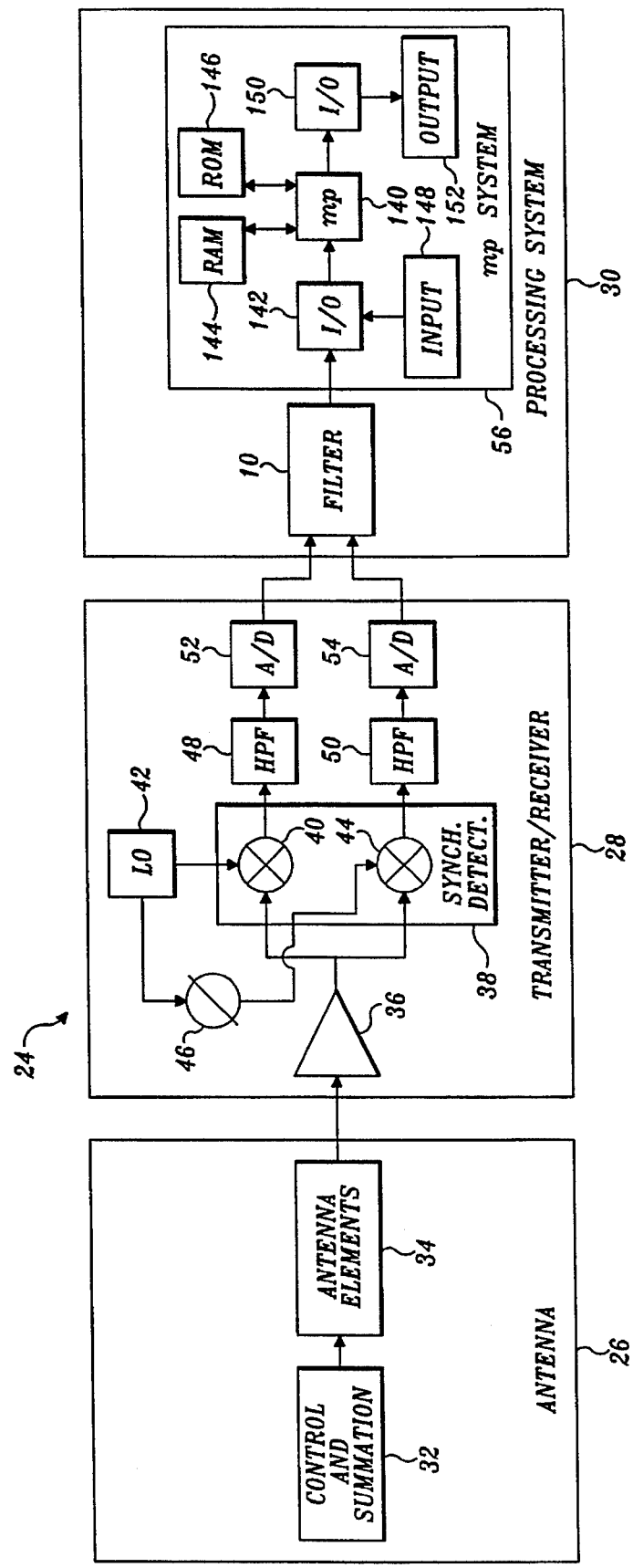
FIG. 7 is a block diagram of a radar system, for transmitting electromagnetic energy into a multipath environment and receiving reflections of energy from targets in the multipath environment, including a digital signal processing version of the multipath matched system constructed in accordance with the present invention, which beneficially combines various multipath signal components that are received.

Turning now to FIG. 7, a radar system 24 employing multiple-hypothesis, multipath-matched filter 10 is shown. Radar system 24 includes an antenna 26, a transmitter/receiver 28, and a processing system 30. Antenna 26 is included to receive and transmit electromagnetic radiation and may be constructed in any one of a variety of configurations. For example, antenna 26 may include an array of modules which collectively transmit and receive electromagnetic radiation along a beam that is steerable by controlling the phase of the individual modules. Each such module may include, for example, orthogonal antenna elements 32 as well as phase control and summation circuitry 34 for allowing the antenna beam to be steered and the operation of the various elements to be cooperatively linked.

Transmitter/receiver 28 applies signals to antenna 26, causing a radar signal to be transmitted generally toward aircraft 14. Transmitter/receiver 28 also receives signals produced at antenna 26 in response to reflections of the radar signal from aircraft 14. Specifically, transmitter/receiver 28 receives the various multipath components of the reflected radiation, at different times, and transfers these analog signals to processing system 30 for subsequent processing.

A preamplifier 36 in transmitter/receiver 28 amplifies the signal components produced by antenna 26 in response to the multipath reflections that are received. Amplified signals from the preamplifier are applied to a synchronous detector 38, which produces corresponding in-phase and quadrature components to preserve phase information concerning the multipath components for further processing and analysis as set forth below. Synchronous detector 38 includes an in-phase detector 40 that mixes the signals from preamplifier 36 with signals having a local oscillator frequency, received from a local oscillator 42. A quadrature detector 44 also mixes the signals from preamplifier 36 with signals from local oscillator 42 after the phase of the local oscillator signals is shifted by 90° by a phase shifter 46.

The in-phase and quadrature components of the multipath reflections output by detectors 40 and 44 are separately filtered by high-pass filters 48 and 50 to remove low frequency components. The resulting filtered, analog, in-phase, and quadrature components are then converted to digital form at separate analog-to-digital (A/D) converters 52 and 54. Digital signals output from A/D converters 52 and 54 include information concerning the magnitude and phase of each of the multipath components required for further processing by processing system 30. As will be appreciated, for hardware processing of signals by processing system 30, it may be preferable to leave the components in analog form.

Processing system 30 performs several functions. Of primary interest with respect to the present discussion, processing system 30 combines the various multipath components to increase the combined signal power, without allowing the cancellative influence of certain multipath components to introduce gaps in the coverage of radar system 24. Processing system 30 also processes the combined multipath signal R to detect, for example, the range and altitude of aircraft 14.

To achieve the desired multipath component combination, processing system 30 employs multiple-hypothesis, multipath-matched filter 10. In the embodiment shown in FIG. 7, filter 10 is largely a hardware-based circuit whose output is processed by a separate microprocessor system 56. As will be described in greater detail below, however, filter 10 may alternatively be software based and implemented as part of microprocessor system 56.

Figure 8:
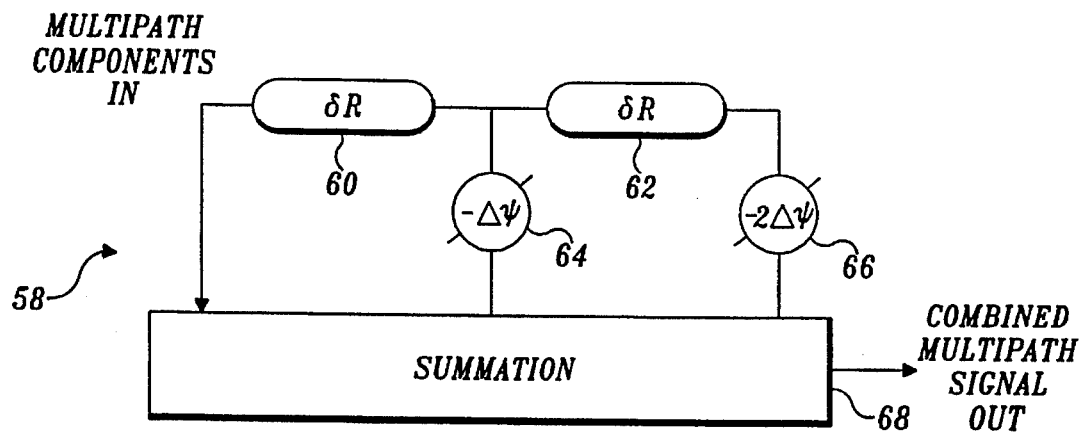
FIG. 8 is a block diagram of an ideal multipath filter.

To understand the operation of matched filter 10, an ideal matched filter 58 will first be discussed. As shown in FIG. 8, ideal filter 58 includes a first adjustable time delay 60, second adjustable time delay 62, first adjustable phase shifter 64, second adjustable phase shifter 66, and summer 68. Each of these components is of conventional construction, with delay lines comprising an inductor-capacitor circuit or even a relatively long coaxial cable employed as time delays, and inductor-capacitor circuits employed as phase shifters.

As will be recalled from the discussion of FIG. 3, the first of the various multipath components received back at transmitter/receiver 28 in the radar application is the component that traverses path I. The remaining components are received later in time. Specifically, the components traversing paths II and III are received at transmitter/receiver 28 a delayed interval $\Delta R$ after the first component and shifted at a phase angle $\psi$ thereto. The multipath component received along path IV is, in turn, received at transmitter/receiver 28 an interval of time 2ΔR later than the path I component and with a phase angle shifted by 2ψ thereto. Ideal matched filter 58 effectively adds these four components together at the same time and same phase.

Figure 9:
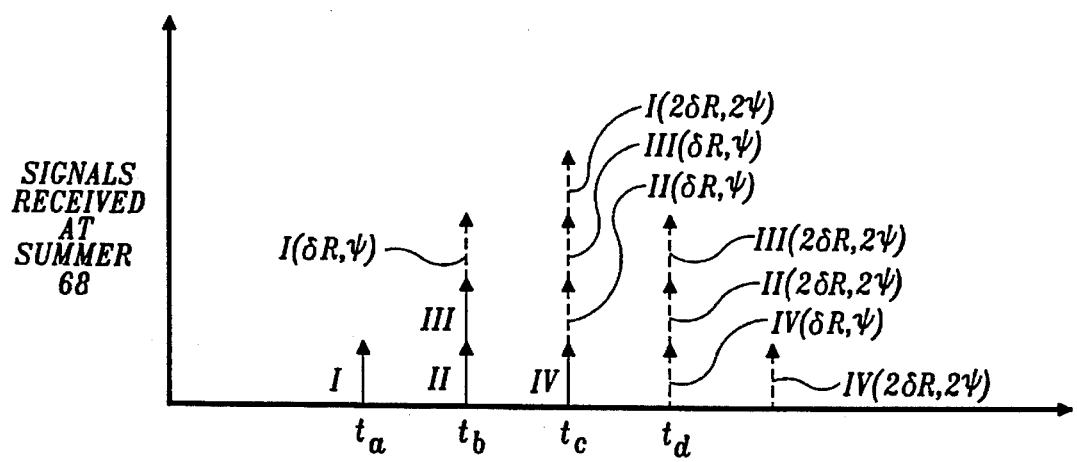
FIG. 9 is a graph illustrating the combination of multipath components achieved by the filter of FIG. 8.

In that regard, the in-phase and quadrature input signals are applied directly to summer 68. FIG. 9 illustrates the temporal relationship of the components received at summer 68. As shown, the path I components are received at time $t_a$, the path II and III components are received at time $t_b$ (δR after $t_a$), and the path IV components are received at time $t_c$ (2ΔR after $t_a$). The in-phase and quadrature input signals are also applied directly to first time delay 60.

The delayed output of first time delay 60 is applied to both second time delay 62 and first phase shifter 64. The output of first phase shifter 64 is applied to summer 68. As a result, each of the components is again applied to summer 68, after being delayed by ΔR and shifted in phase by 2ψ.

The output of second time delay 62 is also applied to second phase shifter 66. The output of phase shifter 66 is, in turn, applied to summer 68. As a result, each of the components is applied to summer 68 a third time after being delayed by 2ΔR and shifted in phase by 2ψ.

Thus, as will be appreciated from FIG. 9, the in-phase and quadrature combination of each multipath component is received at summer 68 at three different times. At time $t_c$, however, summer 68 receives versions of all four multipath components simultaneously.

In that regard, at time $t_c$, which is 2ΔR after the path I component is initially received, the multipath component from path IV is directly received at summer 68. With the multipath components from paths II and III delayed by ΔR at first time delay 60, the delayed versions of these components also reach summer 68 at time $t_c$. Further, delays 60 and 62 cooperatively delay the multipath component from path I by 2ΔR, causing it to also reach summer 68 at time $t_c$. As a result, summer 68 receives all four multipath components at the same time $t_c$, allowing them to be conveniently added.

Summer 68 also receives the signals at time $t_c$ with a common phase. In that regard, the multipath component from path IV is directly received at time $t_c$ without any adjustment in its phase. The multipath components received along paths II and III at time $t_c$ are shifted in phase by c. Finally, the multipath components received along path I at time $t_c$ are shifted in phase by 2ψ.

A matched filter 58 constructed in the preceding manner has an optimal response. As long as filter 58 can be adjusted to provide delay times and phase shifts that match those introduced by multipath environment 16, the multipath components will combine, without cancellation, to maximize the combined multipath signal R. Filter 58 adaptively responds to path length variations and phase changes introduced by multipath environment 16, ensuring that the combined multipath signal R will always remain optimized as shown in FIGS. 4A or 4D. Because no cancellation is introduced, regardless of phase shifts introduced by multipath environment 16, the response of ideal filter 58 is flat, as indicated by curve A in FIG. 6.

The disadvantage with the use of ideal matched filter 58 is that it requires detailed knowledge of multipath environment 16. That information is then used to initiate the necessary adjustments of delays 60 and 62 and phase shifters 64 and 66. As will be appreciated, processing system 30 could obtain the necessary information by, for example, evaluating the influence of multipath environment 16 on test signals or by storing detailed information relating to multipath environment 16. Processing system 30 would, however, necessarily be relatively complex to achieve the desired adjustments.

To obtain some of the operational advantages of ideal filter 58, without requiring detailed information about environment 16 or undue circuit complexity, multiple-hypothesis filter 10 has been developed. As will be discussed in greater detail below, this filter is based upon certain hypotheses regarding the phase shifts and delay times introduced by the various paths traversed by the multipath components.

Beginning with a review of the first hypothesis upon which filter 10 is based, multiple-hypothesis filter 10 "assumes" that the phase shift experienced by each of the multipath components is either 0° or 180°. To understand how filter 10 is constructed to take advantage of this assumption, reference is had to FIG. 10. In the arrangement shown in FIG. 10, filter 10 includes a 0° phase shift block 70, a 180° phase shift block 72, and an output block 74 that collectively form a first assumption block 76 of filter 10.

Before addressing the construction of these blocks in greater detail, their functional operation will be reviewed. In that regard, as will be appreciated from a comparison of FIGS. 4A and 4C, the combined multipath signal R is at a maximum when multipath environment 16 causes a zero shift in the phase of the various path components and the components are added together at the same time (FIG. 4A). On the other hand, the combined multipath signal R is at a minimum when the components are simultaneously added and multipath environment 16 introduces a phase shift of 180° into the components traversing paths II and III (FIG. 4C). Thus, with the various multipath components summed at the same time, the magnitude of the resultant multipath vector R decreases with increasing angles of ψ, reaching zero when ψ is equal to 180°. This is plotted in FIG. 6 as curve B.

On the other hand, if the phase of the multipath components received along paths II and III is adjusted by 180°, the multipath components will completely reinforce each other when paths II and III of multipath environment 16 shift the phase of their multipath components by 180°. Thus, with an artificial phase shift of 180° introduced into the components traversing these paths, the magnitude of the resultant multipath vector R will be zero when ψ equals 0° and gradually increases to a maximum when ψ equals 180°. This response is shown as curve C in FIG. 6.

Functionally, the 0° phase shift block 70 is constructed to combine the in-phase and quadrature analog or digital multipath components in an output whose phase dependency is represented by curve B in FIG. 6. The 180° phase shift block 72 is, alternatively, designed to combine the multipath components in an output whose phase dependency is represented by curve C in FIG. 6. As a result, block 70 will produce a completely reinforced output when the phase shift ψ introduced by multipath environment 16 is equal to 0°, while block 72 will produce a completely reinforced output when the phase shift ψ introduced by multipath environment 16 is equal to 180°.

When the phase shift introduced by multipath environment 16 is between 0° and 180°, however, neither block 70 nor 72 provides an optimal combination of the multipath components. For values of ψ less than 90°, the output of block 70 will be greater, while for values of ψ greater than 90°, block 72 produces the greater output. Output block 74 effectively uses as its output the higher of the two outputs of block 70 and 72. Thus, the response of output block 74 is represented as curve D in FIG. 6.

As will be appreciated, because the necessary phase shift adjustment is assumed to be either 0° or 180°, the overall response of first assumption block 76 depicted by curve D is not as "good," or flat, as that of ideal matched filter 58 represented by curve A in FIG. 6. However, the assumption causes only a relatively slight attenuation of the combined multipath signal R and advantageously requires no knowledge regarding the characteristics of multipath environment 16, allowing filter 10 to be relatively simple to operate.

Having reviewed the operational aspects of first assumption block 76, the construction of block 76 will now be discussed in greater detail. In the preferred arrangement, 0° phase shift block 70, which is responsible for producing an output whose phase-dependency is represented by curve B in FIG. 6, includes a first fixed time delay 78, second fixed time delay 80, and first summer 82. In that regard, an input signal including each of the multipath components is applied to first fixed time delay 78 and first summer 82. The output of first fixed time delay 78 is delayed by an interval $\delta R$, equal to the range gate setting of the system, and then applied to first summer 82 without a phase shift and is also applied to second fixed time delay 80. The output of second delay 80 is delayed by another interval $\delta R$ and then applied to first summer 82 without a phase shift.

Addressing the function and operation of fixed time delays 78 and 80, as will be appreciated from the earlier discussion of ideal matched filter 58, fixed time delays 78 and 80 are included to delay the multipath components sufficiently to allow them to be added together at some common time. With fixed time delays 78 and 80 employed, 0° phase shift block 70 can only be used to produce the filter output when the difference between the length of paths II or III and path I approximates the setting $\delta R$ of the delays. This limitation is related to a second assumption made by filter 10, discussed in greater detail below.

As will be recalled from the earlier comparison of FIGS. 4A through 4C, with no phase adjustment made to the signals applied to summer 82, the output of summer 82 will be at a maximum when $\psi$ is equal to 0° and at a minimum when $\psi$ is equal to 180°. Thus, the output of 0° phase shift block 70 has a phase dependency that follows curve B in FIG. 6.

The 180° phase shift block, which is responsible for producing an output having a phase-dependency represented by curve C in FIG. 6, similarly includes first fixed time delay 84, second fixed time delay 86, a first phase shifter 88, and a summer 90. Each of the input signals are applied directly to first fixed time delay 84 and summer 90. The output of first fixed time delay 84 is applied to both second fixed time delay 86 and first phase shifter 88. The outputs of second fixed time delay 86 and first phase shifter 88 are applied to summer 90.

First and second fixed time delays 84 and 86 produce the same time delay $\delta R$ as fixed time delays 78 and 80. Phase shifter 88 produces a phase shift of 180°. Summer 90 combines the various multipath components at some common time.

As will be appreciated from the earlier discussion of ideal matched filter 58, the inclusion of phase shifter 88 in the center leg of 180° phase shift block 72 causes only the phase of the path II and III multipath components added at summer 90 to be shifted by 180°. With the phase of these components shifted by 180°, the magnitude of the output will be at a minimum when $\psi$ is equal to zero and at a maximum when $\psi$ is equal to 180° (see FIGS. 4A and 4C). Thus, the output of 180° phase shift block 72 will have a phase dependency that is represented by curve C in FIG. 6.

Addressing now the construction of output block 74 of first assumption block 76, as previously noted, output block 74 is included to select the higher of the outputs of blocks 70 and 72 as the output for first assumption block 76. In that regard, in the arrangement shown in FIG. 10, output block 74 includes a first threshold circuit 92, a second threshold circuit 94, and an exclusive-OR logic block 96.

Threshold circuits 92 and 94 compare the outputs of 0° and 180° phase shift blocks 70 and 72 against some threshold level or levels, preferably set to equal crossover point E of curves B and C in FIG. 6. If the output from block 70 or 72 exceeds this threshold, corresponding threshold circuit 92 or 94 passes it on to logic block 96.

As a result, when the phase shift introduced by multipath environment 16 is between 0° and 90°, the output of phase shift block 70 will exceed the threshold, and first threshold circuit 92 will provide its output to logic block 96. On the other hand, when the phase shift introduced by multipath environment 16 is between 90° and 180°, the output of phase shirt block 72 will exceed threshold and threshold circuit 94 will provide its output to logic block 96.

With one of threshold circuits 92 or 94 providing its output to exclusive-OR logic block 96, block 96 will pass that output on as a high output of first assumption block 76. As a result, the output of block 76 has a phase dependency that corresponds to the left-hand portion of curve B and the right-hand portion of curve C in FIG. 6. Collectively, that response is defined by curve D.

Figure 10:
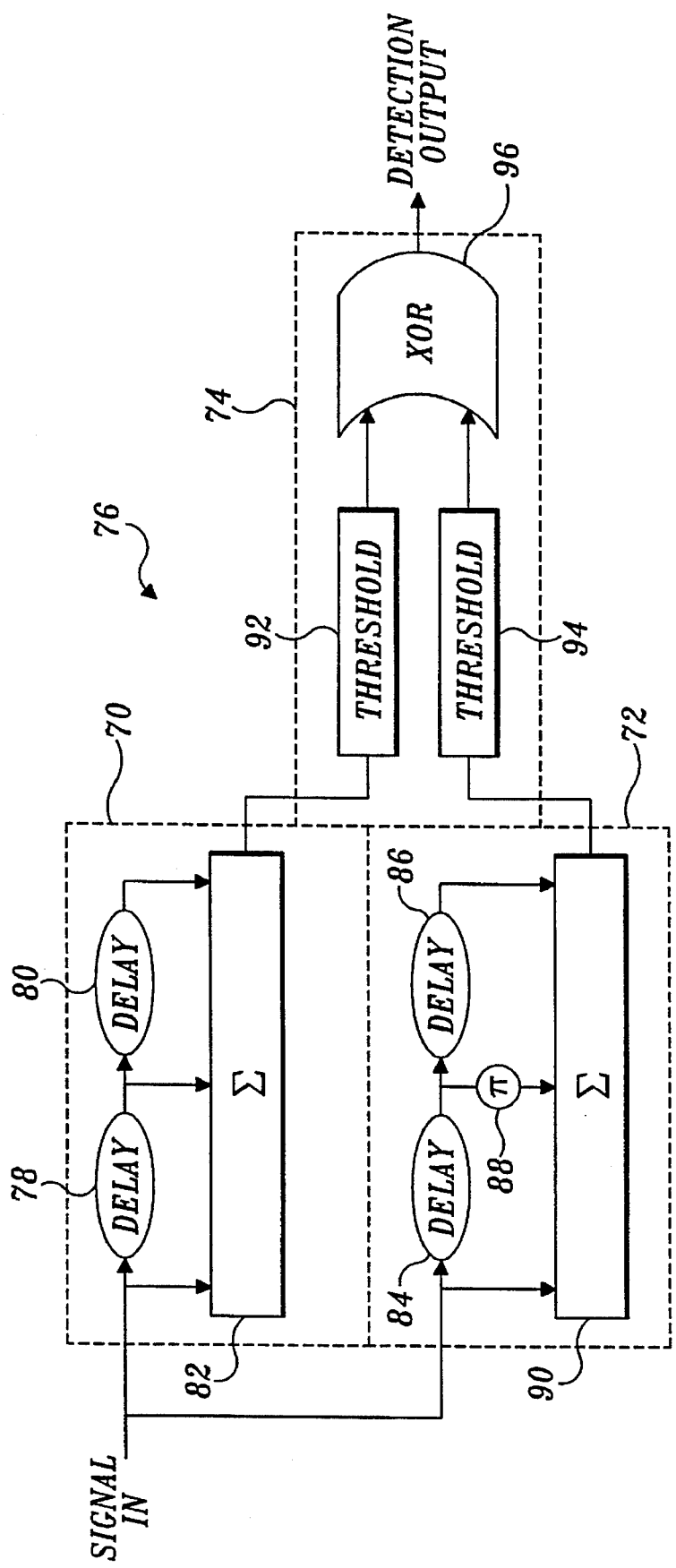
FIG. 10 is a block diagram of an elemental multipath filter for combining signals received along the various signal multipaths and incorporating a first phase-related hypothesis in accordance with this invention.

As will be appreciated, the construction of first assumption block 76 illustrated in FIG. 10 is but one of many suitable arrangements. For example, a single comparator could be used in output block 74 to identify the larger of outputs produced by phase shift blocks 70 and 72, with that output then being provided directly as the output of first assumption block 76. As another variation, because the same delay $\delta R$ is produced by fixed time delays 78 and 84 of phase shirt blocks 70 and 72, as well as fixed time delays 80 and 86, a single pair of delays could be shared by phase shirt blocks 70 and 72 if desired. In such an arrangement, the output of the first delay would be provided directly to first summer 82 and would be applied to summer 90 via 180° phase shifter 88.

As noted, the construction of first assumption block 76 is based upon the hypothesis that the phase shift introduced by multipath environment 16 can be suitably treated as being either 0° or 180°. As also noted, the first assumption block is, however, only useful in providing an output for a particular set of path length constraints. This limitation is related to a second hypothesis used in the development of filter 10.

This second hypothesis is that the path length delays experienced for any multipath environment 16 can be suitably estimated as being only integer multiples of some nominal or minimum range delay $\delta R$ equal to the range gate setting $\delta R$ achievable with transmitter/receiver 28. As will be appreciated, the range gate setting is a function of the pulse repetition rate or bandwidth of the system and determines the ability of the system to resolve path length differences.

Although first assumption block 76 provides an optimal response when the path length differences traversed by the multipath components are proportional to the delays $\delta R$ produced at fixed time delays 78, 80, 84, and 86, in many instances, the delays experienced by signals traversing certain paths of multipath environment 16 may be greater than that minimum value resolvable by the system. The second hypothesis allows suitable outputs to be produced for these variations in multipath environment 16, as follows.

Figure 11:
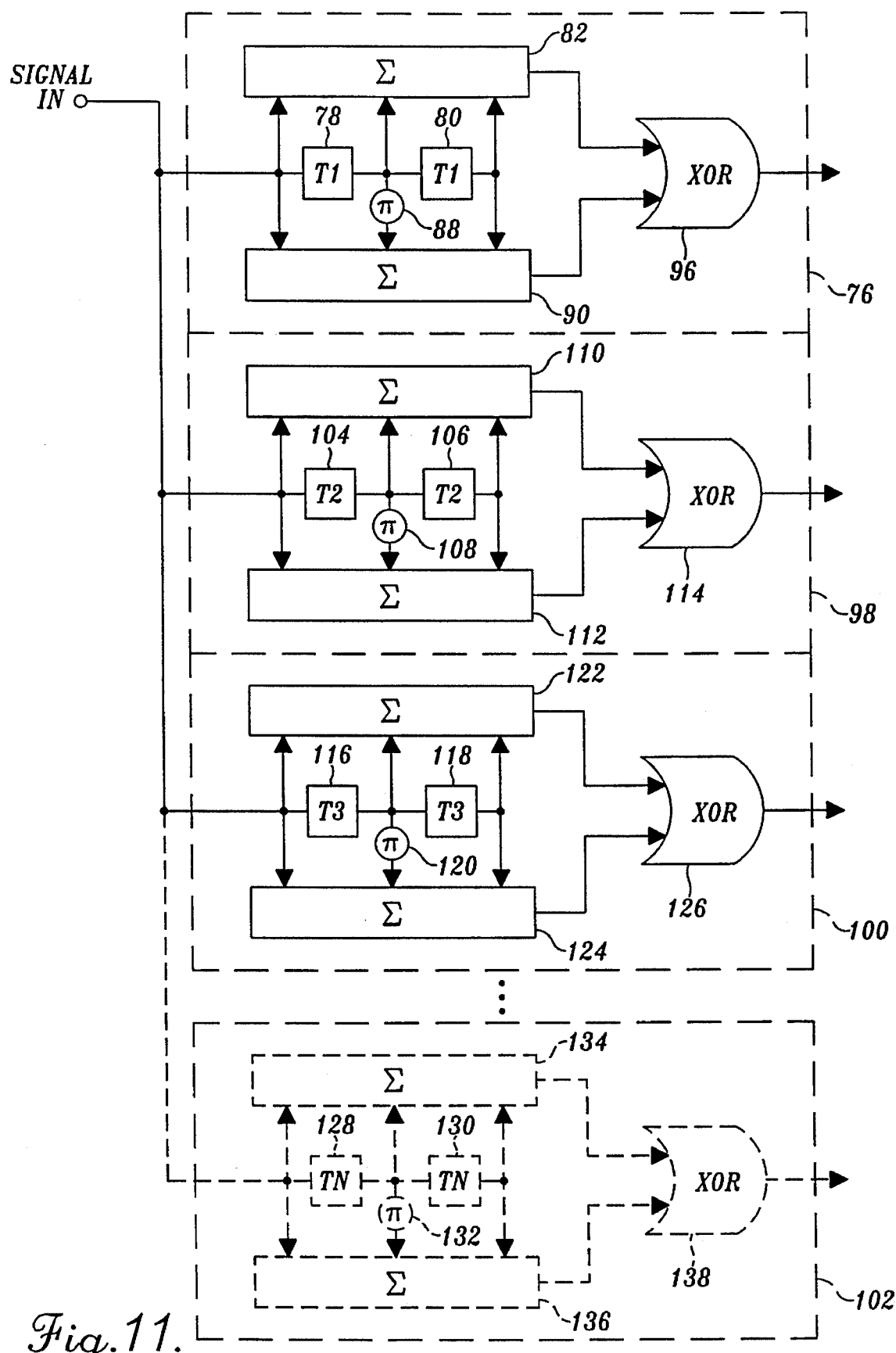
FIG. 11 is a block diagram illustrating a more complicated version of the filter of FIG. 9, incorporating multiple delay-related hypotheses in accordance with this invention.

As shown in FIG. 11, in addition to first assumption block 76, multiple-hypothesis filter 10 includes second, third, and nth assumption blocks 98, 100, and 102, respectively. The construction and operation of assumption blocks 98, 100, and 102 parallels that of first assumption block 76, and each other, with one exception. Specifically, the delay times produced by the various fixed time delays in each block are integer multiples of the delays produced by the fixed time delays of first assumption block 76.

In the embodiment of FIG. 11, first assumption block 76 is modified in the manner previously suggested to use only two fixed time delays, such as 78 and 80, to provide the multipath signal components to summer 82, 180° phase shifter 88, and summer 90. The combined outputs of summers 82 and 90 are applied directly to exclusive-OR logic block 96 without the initial performance of a threshold evaluation, to simplify the circuit. The operation of first assumption block 76 is, otherwise, as described above.

Second assumption block 98 similarly includes a pair of fixed time delays 104 and 106 of duration T2, a 180° phase shifter 108, first and second summers 110 and 112, and an exclusive-OR logic block 114. Third assumption block 100 includes a pair of fixed time delays 116 and 118 of duration T3, a 180° phase shifter 120, first and second summers 122 and 124, respectively, and an exclusive-OR logic block 126. Nth assumption block 102 includes a pair of fixed time delays 128 and 130 of duration TN, a 180° phase shifter 132, first and second summers 134 and 136, respectively, and an exclusive-OR (XOR) logic block 138.

The time delays introduced by fixed time delays 104 and 106 of second assumption block 98 are equal to $2\delta R$. Similarly, the time delays introduced by fixed time delays 116 and 118 of third assumption block 100 are equal to $3\delta R$. The time delays introduced by fixed time delays 128 and 130 of nth assumption block 102 are equal to $N\Delta R$. The outputs of the various assumption blocks are applied to the remainder of the processing system for analysis.

Thus, as will be appreciated, the combined multipath outputs of the various assumption blocks 76, 98, 100, and 102 will be substantially attenuated for all but the particular block that introduces a fixed time delay most nearly approximating that of multipath environment 16. As with the first assumption concerning the phase shifts introduced by environment 16, the second assumption regarding time delays causes some attenuation when compared to the flat response of ideal matched filter 58. However, the degree of attenuation is not particularly great and allows filter 10 to operate without feedback concerning the changing time delays introduced by multipath environment 16.

As will be appreciated, although the preferred embodiment of filter 10 relies upon a first assumption that the phase shift $\psi$ introduced by environment 16 is either 0° or 180° and a second assumption that the time delays introduced are some integer multiple of a nominal value $\delta R$, additional assumptions could be made. For example, the phase shift $\psi$ could be assumed to be 0°, 60°, 120°, or 180° or the time delay could be assumed to include one-half, as well as integer, multiples of the nominal delay. In either case, the added complexity of the assumptions would allow the attenuation experienced by the combined multipath output to more nearly approximate the flat response of ideal matched filter 58. However, the decreased attenuation would be achieved at the expense of circuit complexity and, in the preferred arrangement, only the more limited assumptions are employed.

The outputs of the various assumption blocks of filter 10 are ultimately processed by microprocessor system 56. As shown in FIG. 7, system 56 includes a microprocessor 140 coupled to filter 10 by an interface 142. Data and program storage for microprocessor 140 are provided by a random access memory (RAM) 144 and read only memory (ROM) 146. External inputs to the system can be introduced by way of inputs 148 coupled to interface 142. Similarly, external outputs can be generated by microprocessor 140 via an interface 150 and outputs 152.

Microprocessor 140 receives and interprets the various outputs of filter 10 to identify and evaluate the combined multipath signal to determine, for example, the range and direction of the object at aircraft 14 in accordance with program instructions stored in ROM 146. Microprocessor 140 may further be instructed to control the operation of, for example, antenna 26 and transmitter/receiver 28.

As noted previously, microprocessor system 56 may also be constructed to implement multiple-hypothesis filter 10 in accordance with program instructions stored in ROM 146. In that regard, a flow chart depicting the operation of microprocessor system 56 as filter 10 is provided in FIG. 12.

As will be described in greater detail, the set of instructions includes a sequence or routine that implements the hypothesis that the phase shift introduced by multipath environment 16 can be suitably corrected by a variation of either 0° or 180°. This sequence of instructions is repeated in a loop that implements the hypothesis that the range delay of environment 16 can be approximated as integer multiples of $\delta R$. A sequence of instructions may be also included to enhance the filter's performance through an iteration of the hypothesis process, at the expense of additional software complexity.

Figure 12:
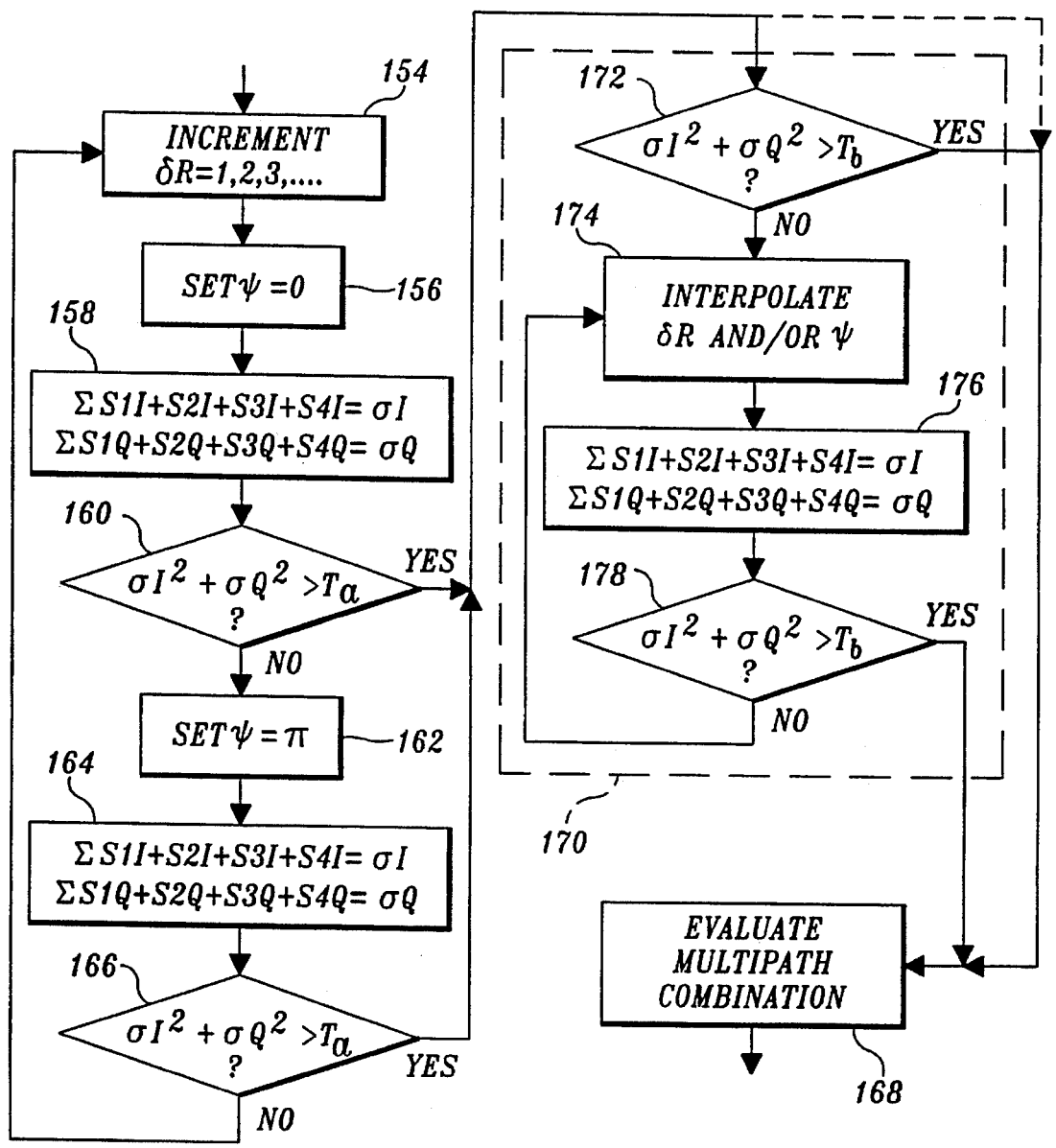
FIG. 12 is a block diagram of a software-based implementation of a filter constructed in accordance with the invention.

Reviewing the operation of software filter 10 in greater detail, as shown in FIG. 12, a first value for the assumed path length difference is initialized at block 154. Specifically, $\Delta R$ is initially taken as the range gate setting $\delta R$ of transmitter/receiver 28. Next, at block 156 the phase shift $\psi$ is set to 0°.

The resultant or combined multipath signal R is then constructed from the in-phase and quadrature elements of the various multipath components at block 158. In that regard, with the appropriate delay introduced, the in-phase elements S1I, S2I, S3I, and S4I of all four multipath components are summed to produce a resultant in-phase component $\sigma I$. Similarly, the quadrature elements S1Q, S2Q, S3Q, and S4Q of all four multipath components are summed to produce a resultant quadrature component $\sigma Q$.

At block 160, two steps are performed. First, the in-phase and quadrature components $\sigma I$ and $\sigma Q$ are squared and their squares added together. As will be appreciated, the resultant quantity is proportional to the magnitude of the combined multipath signal R.

Second, the resultant multipath signal R is compared to a threshold $T_a$ that is defined in terms of, for example, the attenuation experienced at the crossover point E of curves B and C in FIG. 6. If the threshold $T_a$ is exceeded, then the assumed values of $\delta R$ for $\Delta R$ and 0° for $\psi$ typically allow the multipath components received to be suitably combined for the currently existing parameters of multipath environment 16.

Thus, if threshold $T_a$ is exceeded, the combined multipath signal R may be ready for use in evaluating characteristics of aircraft 14. On the other hand, if the threshold $T_a$ is not reached, the assumptions made concerning the necessary adjustments to $\Delta R$ and $\psi$ are inadequate. As a result, the phase adjustment may be altered to set $\psi$ equal to 180° at block 162.

Then, at block 164, the combined multipath signal R is determined for this new set of assumptions of $\Delta R$ equal to $\delta R$ and $\psi$ equal to 180°. Specifically, in-phase elements S1I, S2I, S3I, and S4I of all four multipath components are summed to produce a resultant in-phase component $\sigma I$.

Quadrature elements S1Q, S2Q, S3Q, and S4Q of all four multipath components are summed to produce a resultant quadrature component σQ.

The resultant in-phase and quadrature components σI and σQ are next squared and their squares added together at block 166 to provide an output that is proportional to the magnitude of the combined multipath signal R. This output, produced at block 166, is also compared against the threshold $T_a$ to determine whether the adjustment to ψ allowed the multipath components to be combined without introducing an undesirable level of attenuation.

If the threshold $T_a$ is exceeded, then the combined multipath signal R may be ready for use in evaluating characteristics of aircraft 14. On the other hand, if threshold $T_a$ is not exceeded, the assumptions made concerning the necessary adjustments to ΔR and ψ are inadequate. As a result, the program will increment the value assigned to ΔR by an integer multiple of δR at block 154 to 2δR in accordance with the second hypothesis. The operations represented by blocks 156 through 166 are then repeated for this new assumption regarding the path length differences introduced by multipath environment 16.

As will be appreciated, this loop is repeated until the two hypotheses regarding the path length differences and phase adjustments introduced by environment 16 yield values for ΔR and ψ that allow the multipath components to be combined with relatively little attenuation. As a result, the threshold $T_a$ will be exceeded at either block 160 or block 166.

In that event, the combined multipath signal R may be considered adequate and the software then used to evaluate the multipath signal R, as well as the successful adjustments made to ΔR and ψ, to determine characteristics about aircraft 14 and multipath environment 16 at block 168. For example, the range, height, and direction of aircraft 14 may be determined, along with the phase shift introduced by environment 16.

As noted previously, however, in some instances it may be desirable to allow the multipath components to be combined with less attenuation than occurs when relying upon the two hypotheses represented by blocks 154 through 166. Thus, in certain applications, microprocessor system 56 may determine that additional accuracy is required and pass the output of block 160 or 166 to an interpolative block 170, before the combined multipath signal R is passed on to block 168.

The purpose of interpolative block 170 is to refine the hypotheses concerning ΔR and ψ to reduce the overall attenuation experienced and flatten the response curve D shown in FIG. 6. To that end, the in-phase and quadrature components σI and σQ of the resultant multipath signal R are squared and their squares summed at block 172 to provide an output that is proportional to the magnitude of the combined multipath signal R. This output is the same as that evaluated at block 160 or 166, but it is now compared against a new higher threshold $T_b$. If that higher threshold $T_b$ is exceeded, further interpolation is not required because the values established for ΔR and ψ in the preceding blocks already allow the multipath components to be combined with less attenuation than might have been expected. If threshold $T_b$ is exceeded, operation of the program passes to block 168 for evaluation of the combined multipath signal R.

On the other hand, if the threshold $T_b$ is not exceeded, then some interpolation of the values assigned for ΔR and ψ may be able to achieve the desired reduction in attenuation. As a result, at block 174 the value assigned to ΔR may be iteratively assigned an intermediate value such as 1.5 δR, 2.5 δR, 3.5 δR, and so on. Alternatively, the value assigned to ψ may be iteratively assigned an intermediate value such as 60°, 90°, or 120°.

The in-phase and quadrature components σI and σQ of the resultant multipath signal R are then computed at block 176. At block 178, these components are squared and their squares summed to evaluate the magnitude of the resultant signal. If that magnitude is greater than the second threshold $T_b$, then the iteration has been successful and the reduced attenuation achieved. As a result, the output will be applied to the final processing block 168 for analysis. On the other hand, if the threshold $T_b$ has not been exceeded, the flow of the program may be returned to block 174 for an iterative adjustment to ΔR or ψ. This process is repeated until the desired reduction in the attenuation of the combined multipath signal R is achieved, or until, for example, a predetermined interval of time expires indicating that the reduced level of attenuation cannot be suitably achieved given the current operational constraints of the system.

The preceding discussion of filter 10 has considered its use in radar applications in which the multipath components received at transmitter/receiver 28 traverse multipath environment 16 in two directions. In a communication application, only multipath components corresponding to, for example, the components received along paths I and II are encountered. As a result, the structure and operation of filter 10 is altered in the following manner.

Specifically, because a phase shift of 2ψ will no longer be introduced by environment 16, the accuracy of the first hypothesis regarding phase is enhanced. Thus, the overall complexity of the approach can be reduced. For example, the second time delays are no longer required in the hardware embodiments of FIGS. 10 and 11.

Similarly, the number of alternative paths formed by environment 16 and accounted for by filter 10 may vary significantly. In that regard, filter 10 may be constructed to accommodate the influence of an environment 16 including additional paths introduced by the ground and ionosphere. For the software embodiment, this would require the inclusion of additional terms in computations of blocks 158, 164, and 176.

As will be appreciated, the use of a filter 10 implemented in any of the fashions described above has a number of advantages. By summing the various multipath components, returns from aircraft 14 are enhanced making detection easier and more reliable. Further, filter 10 is constructed to eliminate the signal loss or fading that might otherwise be caused by the cancellative effect of the multipath components.

Those skilled in the art will recognize that the embodiments of the invention disclosed herein are exemplary in nature and that various changes can be made therein without departing from the scope and the spirit of the invention. In this regard, and as was previously mentioned, the invention is readily embodied in either hardware or software. Further, it will be recognized that the complexity of the hypotheses and the number of multipath components accounted for can be altered as desired. Because of the above and numerous other variations and modifications that will occur to those skilled in the art, the following claims should not be limited to the embodiments illustrated and discussed herein.

The embodiments of the invention in which an exclusive property or privilege is claimed are defined as follows:

1. A multiple-hypothesis method for processing signals received along a plurality of paths included in a multipath environment, said technique including:

(a) delaying the signals received along select ones of the paths by select delay times and adjusting the phases of the signals by select phase adjustments to produce matched signals, the select delay times being selected in accordance with a first hypothesis concerning the paths the signals are received along and the select phase adjustments being selected in accordance with a second hypothesis concerning the paths the signals are received along; and (b) combining the matched signals to produce a combined signal.

2. The method of claim 1, wherein the signals exhibit a bandwidth and wherein the select delay times are selected from integer multiples of a value, that is a function of the bandwidth.

3. The method of claim 1, wherein the select phase adjustments are selected from two values and wherein the two values are 0° and 180°.

4. The method of claim 1, wherein the first hypothesis concerning the paths concerns the delay experienced by signals traveling along the paths and wherein the second hypothesis concerning the paths concerns the phase adjustment experienced by signals traveling along the paths.

5. The method of claim 1, further comprising:

(a) transmitting the signals from a source aircraft site to a target site; and (b) receiving signals back for the target site after the signals have traversed the plurality of paths in the multipath environment.

6. The method of claim 5, further comprising processing the combined signal to determine the range of the target site from the source aircraft site.

7. The method of claim 6, further comprising processing the combined signal to determine the elevation of the target site.

* * * * *